(12) United States Patent
Barnes, IV et al.

(10) Patent No.: US 8,780,211 B2
(45) Date of Patent: Jul. 15, 2014

(54) OPTICAL ALIGNMENT STRUCTURES AND ASSOCIATED METHODS

(71) Applicant: OmniVision Technologies, Inc., Santa Clara, CA (US)

(72) Inventors: George C. Barnes, IV, Westminster, CO (US); Goran M. Rauker, Longmont, CO (US); Mark Meloni, Longmont, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/932,656

(22) Filed: Jul. 1, 2013

(65) Prior Publication Data

US 2013/0294815 A1 Nov. 7, 2013

Related U.S. Application Data

(62) Division of application No. 12/819,897, filed on Jun. 21, 2013, now Pat. No. 8,477,195.

(51) Int. Cl.
*H04N 17/00* (2006.01)
*H04N 17/02* (2006.01)
*H01L 21/00* (2006.01)

(52) U.S. Cl.
USPC .............................. 348/190; 438/64; 438/66

(58) Field of Classification Search
USPC ............... 348/187, 190, 340; 438/64, 66, 73; 700/213
See application file for complete search history.

(56) References Cited

U.S. PATENT DOCUMENTS

| | | | |
|---|---|---|---|
| 5,007,708 | A | 4/1991 | Gaylord et al. |
| 5,694,247 | A | 12/1997 | Ophey et al. |
| 5,748,371 | A | 5/1998 | Cathey, Jr. et al. |
| 5,877,090 | A | 3/1999 | Padmapani et al. |
| 6,366,335 | B1 | 4/2002 | Hikmet et al. |
| 7,469,202 | B2 | 12/2008 | Dowski, Jr. et al. |
| 2003/0169944 | A1 | 9/2003 | Dowski, Jr. et al. |
| 2004/0003689 | A1 | 1/2004 | Bryan |
| 2004/0191948 | A1 | 9/2004 | Ertel et al. |
| 2004/0228005 | A1 | 11/2004 | Dowski, Jr. |
| 2005/0018962 | A1 | 1/2005 | Cho et al. |
| 2008/0290435 | A1 | 11/2008 | Oliver et al. |
| 2009/0045325 | A1 | 2/2009 | Tomuta et al. |

FOREIGN PATENT DOCUMENTS

| | | |
|---|---|---|
| EP | 1420453 A2 | 5/2004 |
| JP | 6060757 | 4/1985 |
| WO | 2004027880 | 4/2004 |
| WO | 2008020899 A2 | 2/2008 |

OTHER PUBLICATIONS

Lim, et al. In "Spatially Varying Color Correction Matrices for Reduced Noise" HP Laboratories Palo Alto Jun. 2, 2004, pp. 1-15.

(Continued)

*Primary Examiner* — Kelly L Jerabek
(74) *Attorney, Agent, or Firm* — Lathrop & Gage LLP

(57) ABSTRACT

A method of mutually aligning first and second imaging system fixturing components forms a first alignment structure on the first imaging system fixturing component, a second alignment structure on the second imaging system fixturing component, and engages the first and second alignment structures to align, with optical accuracy, the first and second imaging system fixturing components.

3 Claims, 11 Drawing Sheets

(56) References Cited

OTHER PUBLICATIONS

Kuiper, S & Hendriks, B.H.W., Variable focus liquid lens for miniature cameras, Applied Physics Letters, vol. 85, No. 7, Aug. 16, 2004, pp. 1128-1130.
PCT/US2007/009347, Invitation to Pay Additional Fees mailed May 6, 2008, 8 pages.
PCT/US2007/009347, International Search Report & Written Opinion mailed Aug. 1, 2008, 28 pages.
PCT/US2007/009347, International Preliminary Report on Patentability, Feb. 19, 2009, 17 pages.
European Application No. 07 835 728.2 Communication pursuant to Article 94(3) EPC, Jul. 29, 2010, 5 pages.
European Application No. 07 835 728.2 Reply to Communication pursuant to Article 94(3) EPC, filed Jan. 27, 2011, 99 pages.

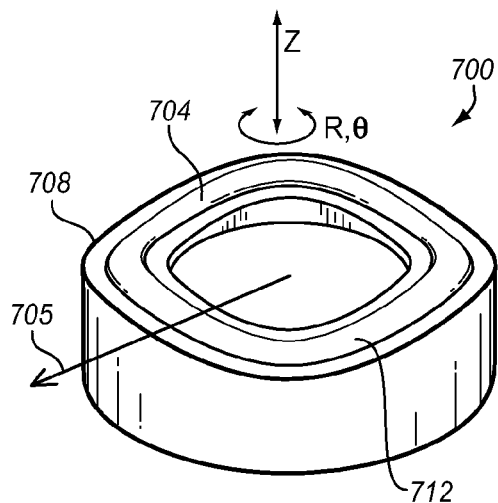
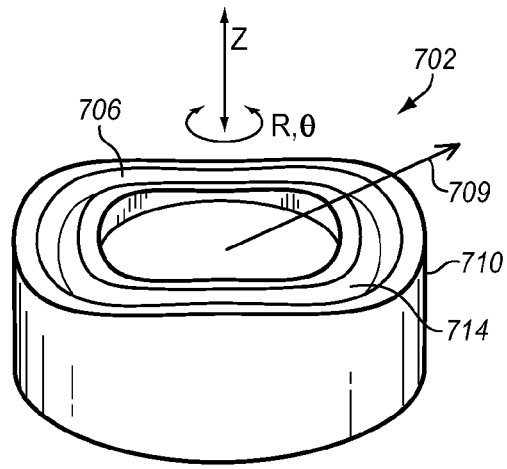
FIG. 7A  FIG. 7B
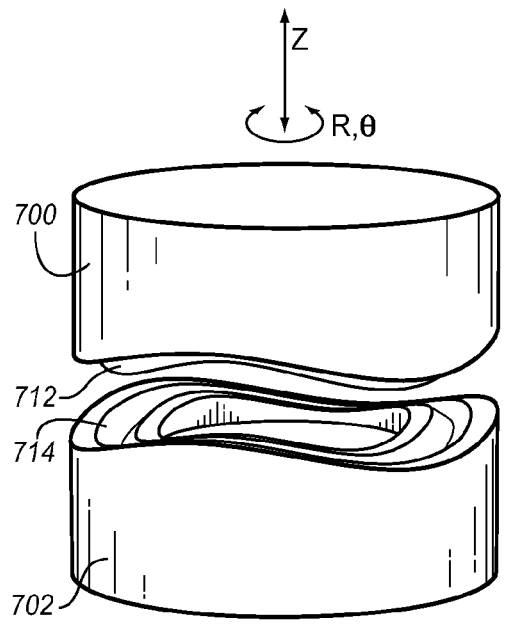
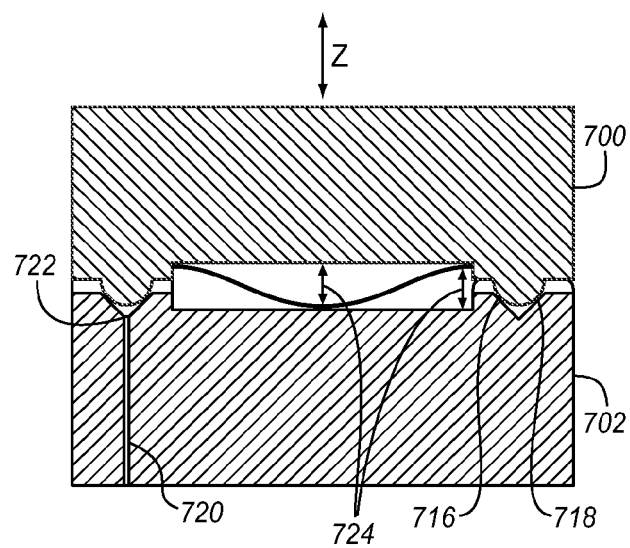
FIG. 7C  FIG. 7D

OPTICAL ALIGNMENT STRUCTURES AND ASSOCIATED METHODS

RELATED APPLICATIONS

This application is a divisional application of U.S. patent application Ser. No. 12/819,897, filed Jun. 21, 2013, the disclosure of which is incorporated herein by reference.

BACKGROUND

Wafer-scale arrays of imaging systems offer the benefits of vertical (i.e., along the optical axis) integration capability and parallel assembly. Conventional wafer-scale imaging systems are known, however, to suffer from a lack of precise integration associated with parallel assembly. Offsets of optical elements, due to thickness non-uniformities or systematic misalignment (including translations and rotations) of optical elements relative to an optical axis, may significantly degrade the integrity of one or more imaging systems throughout the array. In rotational misalignments of the common base, the offsets of optical elements are proportional to the distance from the substrate's center of rotation to the optical element. For example, a rotational misalignment of one milliradian (0.0573 degrees), for a 300 millimeter substrate, can result in a 150 micron offset for optical elements near the substrate's perimeter, thereby significantly reducing imaging system quality. Conventional wafer-scale technologies typically enable alignment only at mechanical tolerances of several microns, and do not enable alignment at optical tolerances (i.e., on the order of a wavelength of electromagnetic energy of interest), which would be the alignment accuracy required for precise imaging system manufacture.

One high-precision wafer-scale array system is disclosed in Patent Cooperation Treaty Publication No. WO/2008/020899, filed 17 Apr. 2007, which is incorporated by reference herein. WO/2008/020899 discloses several embodiments related to the alignment of one or more fabrication masters with a vacuum chuck and/or a common base to simultaneously form a plurality of high quality imaging systems. A fabrication master may include features that form optical elements, and may be used to form an array of optical elements on the common base. As disclosed in WO/2008/020899, the common base can be an array of image detectors and/or the common base can support an array of layered optical elements thereon. The fabrication master and the vacuum chuck may thus be used to form an array of imaging systems supported on the common base.

Precise alignment of an imaging system fixturing component, such as the fabrication master, chuck, or common base, or alignment of two or more of such imaging system fixturing components together, is explained with reference to FIG. 1. FIG. 1 shows an oblique perspective view of a cylindrical object 100, whose alignment is defined according to a coordinate system 102. Cylindrical object 100 represents one of the aforementioned imaging system fixturing components. When affixed to a point in space, or to a second object (not shown), coordinate system 102 defines the translations and rotations of object 100 with respect to the point in space or second object. Translations of object 100 are defined by the three orthogonal x-, y-, and z-axes as indicated by directional arrows X, Y, and Z, respectively; and rotations of object 100 are defined by rotations about each of the three orthogonal axes as indicated by directional arrows A, B, and C, respectively (also referred to as pitch, roll, and yaw). Alignment of object 100 in all six directions (i.e., A, B, C, X, Y, and Z) is referred to as full kinematic alignment, while alignment of the object in less than all six directions is referred to as pseudo-kinematic alignment.

In order to facilitate precise and accurate alignment between object 100 and the second object, each can include visual and/or structural alignment features. Visual alignment features (referred to herein as "alignment marks" or "fiducial marks") are generally markings on each of the objects that facilitate the visual alignment of the objects with respect to each other. Structural alignment features (referred to herein as "alignment structures") on each object can mechanically assist in the alignment of the objects with respect to each other, or allow the objects themselves to self-align when mated. Corresponding alignment structures/marks on two objects are collectively referred to as a set of alignment structures/marks.

More specifically, a set of alignment structures/marks that indicates displacement between two or more objects with respect to all six degrees of freedom with respect to coordinate system 102 (i.e., displacement along the X, Y, and Z axes and rotation about each of the X, Y, and Z axes) will enable full kinematic alignment. On the other hand, a set of alignment structures/marks that indicates displacement between two or more objects with respect to only some, but not all six, degrees of freedom in coordinate system 102 (e.g., displacement along the X, Y and Z axes but not rotation about the axes) may only enable pseudo-kinematic alignment.

When used in forming optical elements for an imaging system on the common base, the fabrication master should be accurately and precisely aligned with the common base and/or the vacuum chuck that supports the common base. For example, if the common base includes an array of image detectors supported thereon, then optical elements formed using the fabrication master should be aligned accurately and precisely with their corresponding image detectors. Alignment structures on each of the fabrication master, the vacuum chuck, and the common base, in this example, may facilitate the alignment of the fabrication master with respect to the vacuum chuck and/or common base during the formation of the optical elements.

One prior art example of a set of alignment structures is illustrated in FIGS. 2 and 3. FIG. 2 is a top perspective view of a vacuum chuck 200 supporting a common base 202 thereon, and FIG. 3 is a top perspective view of a fabrication master 300 configured to be engaged with vacuum chuck 200 and common base 202. Common base 202 includes a generally planar surface 204. In FIGS. 2 and 3, as well as in the other figures throughout this disclosure, specific instances of an individual element of a plurality are referred to by use of a numeral in parentheses (e.g., convex alignment element 306(1)) while numerals without parentheses refer to the element generally (e.g., convex alignment elements 306). Common base 202 can be configured to support an array of image detectors, such as complementary-metal-oxide-semiconductor (CMOS) image detectors.

Continuing to refer to FIGS. 2 and 3, fabrication master 300 includes a plurality of features 302 configured for forming optical elements therefrom; only three of such features 302 are labeled in FIG. 3 for illustrative clarity. Fabrication master 300 can be used to form on surface 204 a plurality of optical elements corresponding to features 302. For example, by disposing a surface 304 of fabrication master 300 proximate to surface 204 of common base, with a moldable or shapeable material disposed therebetween, features 302 can be used to mold optical elements on surface 204.

As shown in FIG. 2, vacuum chuck 200 includes cylindrical alignment elements 206(1), 206(2) and 206(3) as alignment structures. Fabrication master 300 includes convex alignment elements 306(1), 306(2) and 306(3) as respectively corresponding alignment structures. When engaged in a cooperative manner, cylindrical elements 206 and convex elements 306 define the translation and tilts (i.e., rotations about the two axes that are in the plane of surface 204 or surface 304) between vacuum chuck 200 and fabrication master 300. However, rotational movement about the axis normal to surface 204 or surface 304 (e.g., as illustrated by arrow 210 in FIG. 2) between the two imaging system fixturing components can still be effected by active, external forces, such as those from an operator or a machine (not shown). Accordingly, the set of alignment structures defined by cylindrical alignment elements 206 and convex alignment elements 306 enables only pseudo-kinematic alignment in the example shown in FIGS. 2 and 3.

However, angular alignment of fabrication master 300 with respect to vacuum chuck 200 can be provided by including fiducial marks on both objects. Such fiducial marks act to indicate visually when fabrication master 300 is in proper angular alignment with respect to vacuum chuck 200. Although fiducial marks can facilitate such angular alignment, they do not generally contribute to self-alignment (also referred to as passive alignment) between the objects. An operator and/or machine typically rotates one or both of vacuum chuck 200 and fabrication master 300 until the fiducial marks visually indicate proper angular alignment. In this example, the fiducial marks are represented by radial lines 310(1) and 310(2) configured for alignment with corresponding radial lines (not shown) on vacuum chuck 200. Concentric ring 312 may also serve as a fiducial mark by aligning with perimeter 212 of common base 202. Verniers 208(1) and 208(2) on vacuum chuck 200, and corresponding verniers 308(1) and 308(2) on fabrication master 300, illustrate another example of such cooperative fiducial marks for facilitating angular alignment.

FIG. 4 shows a cross-sectional view of a prior art replication system 400 including alignment structures 410 and 412 on a vacuum chuck 402 and alignment structure 414 on fabrication master 404. Alignment structures 410 and 412 are shown engaged with a corresponding alignment structure 414. A common base 406 is secured onto vacuum chuck 402 and, by use of alignment structures 410, 412, and 414, aligned with respect to fabrication master 404. As shown in FIG. 4, fabrication master 404 includes a plurality of structures 408 for defining optical elements. A press 416 is used in replication system 400 to retain fabrication master 404 against common base 402.

Still referring to FIG. 4, alignment structures 410, 412, and 414 cooperate to constrain the degrees of freedom in translations and tilts of fabrication master 404 with respect to vacuum chuck 402. In this example, rotation of fabrication master 404 with respect to vacuum chuck 402 is still primarily defined by an active external alignment force (e.g., press 416). Accordingly, the set of alignment structures of replication system 400 may enable only pseudo-kinematic alignment of fabrication master 404 with respect to vacuum chuck 402.

FIG. 5 shows a perspective view of another example of a prior art alignment system 500, which includes a vacuum chuck 502, a fabrication master 504 and a vision system 506. In one process of controlled engagement, fabrication master 504 and vacuum chuck 502 are aligned relative to one another in the θ-direction before being brought into engagement in the Z-direction. In the example shown in FIG. 5, alignment in the θ-direction is sensed electronically by vision system 506 to determine the relative positional alignments between an indexing mark 508 on fabrication master 504 and an indexing mark 510 on vacuum chuck 502. Vision system 506 produces a signal that is sent to a computer processing system (not shown), which interprets the signal to provide positional control of one or both of vacuum chuck 502 and fabrication master 504 relative to each other. Displacement or translation along the Z- and R-directions is controlled by mechanical alignment structures, such as by the alignment structures shown in FIGS. 2 through 4. Accordingly, the combination of aligning structures and features illustrated in FIG. 5 enable pseudo-kinematic alignment of vacuum chuck 502 with respect to fabrication master 504 in the θ, R, and Z directions.

FIG. 6 shows a cross-sectional view of another exemplary set of prior art alignment structures. In this example, a fabrication master 602 is engaged and mated with a vacuum chuck 600, with a common base 604 being secured onto vacuum chuck 600. The alignment structure on vacuum chuck 600 is a v-groove 606 formed on or into a surface 608 of vacuum chuck 600. As shown in FIG. 6, v-groove 606 is formed on a surface 608. More specifically, a convex protrusion 610 cooperatively aligns with v-groove 606 when fabrication master 602 and vacuum chuck 600 are engaged. While v-groove 606 and convex protrusion 610 limit translation and tilt between fabrication master 602 and vacuum chuck 600 when engaged, this set of alignment structures generally defines only pseudo-kinematic alignment between fabrication master 602 and vacuum chuck 600, and not full kinematic alignment in and of themselves.

SUMMARY

In an embodiment, a method for mutually aligning first and second imaging system fixturing components includes forming a first alignment structure on the first imaging system fixturing component, and forming a second alignment structure on the second imaging system fixturing component. The method further includes engaging the first and second alignment structures to align, with optical accuracy, the first and second imaging system fixturing components with respect to each other.

In an embodiment, a method for machining an alignment structure having a modulated contour on an imaging system fixturing component includes providing parameters for a machining tool and a contour of the alignment structure. The method further includes generating a two-dimensional model of the alignment structure, defining a rasterized spiral tool path for the machining tool, and machining the alignment structure on the imaging system fixturing component using a tool-compensated model, the tool-compensated model being modulated in at least one coordinate direction by a mathematical function.

In an embodiment, a high precision system for repeatably engaging a plurality of imaging system fixturing components includes a common base, a chuck capable of supporting the common base, and a fabrication master. A first alignment structure is disposed on at least one of the chuck and the common base, and a second alignment structure is disposed on the fabrication master. When the first and second alignment structures are brought into engagement, alignment between the fabrication master and chuck (or common base) is effected with optical accuracy. The chuck, common base, and fabrication master are thus repeatedly engageable with optical accuracy.

In an embodiment, an imaging system fixturing component includes at least one generally flat surface and a generally continuous feature formed on or in the generally flat surface, a contour of the feature being a function of at least one coordinate direction.

In an embodiment, a method for aligning and forming optical elements with a common base includes forming a base alignment structure on the common base, the base alignment structure having a mathematically defined contour that is interrelated in at least two coordinate directions. The method further includes forming a first alignment structure on a first fabrication master, the first fabrication master being configured for shaping a first moldable material. The first alignment structure is configured to include a mathematically defined contour that is interrelated in at least two coordinate directions and capable of mating with the base alignment structure. The method further includes engaging the common base and the first fabrication master by mating the base alignment structure with the first alignment structure, thereby shaping the first moldable material to align and form at least one of the optical elements.

BRIEF DESCRIPTION OF DRAWINGS

The present disclosure may be understood by reference to the following detailed description taken in conjunction with the drawings briefly described below. It is noted that, for purposes of illustrative clarity, certain elements in the drawings may not be drawn to scale.

FIG. 7A is a perspective view of an imaging system fixturing component having an alignment structure, according to an embodiment.

FIG. 7B is a perspective view of an imaging system fixturing component having an alignment structure capable of mating with the alignment structure shown in FIG. 7A, in accordance with an embodiment.

FIG. 7C is a perspective view of the imaging system fixturing components shown in FIGS. 7A and 7B in a vertical arrangement and oriented for engagement, in accordance with an embodiment.

FIG. 7D is a cross-sectional sectional view of the imaging system fixturing components shown in FIGS. 7A and 7B mated and engaged, in accordance with an embodiment.

DETAILED DESCRIPTION OF DRAWINGS

Figure 1:
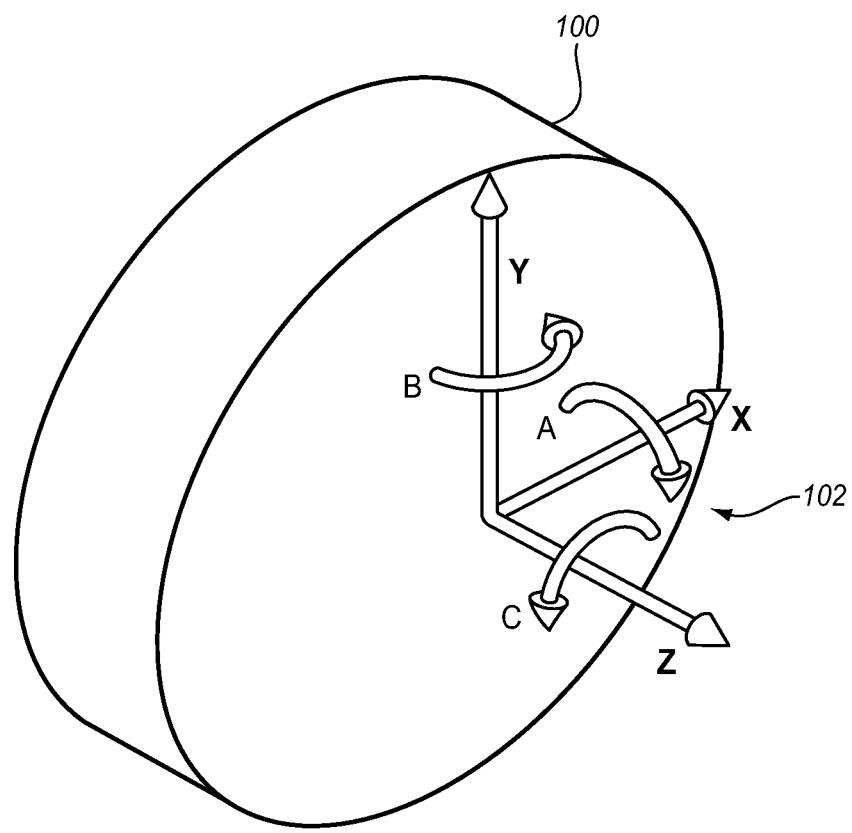
FIG. 1 is an oblique perspective view of a coordinate system for a cylindrical object.
Figure 2:
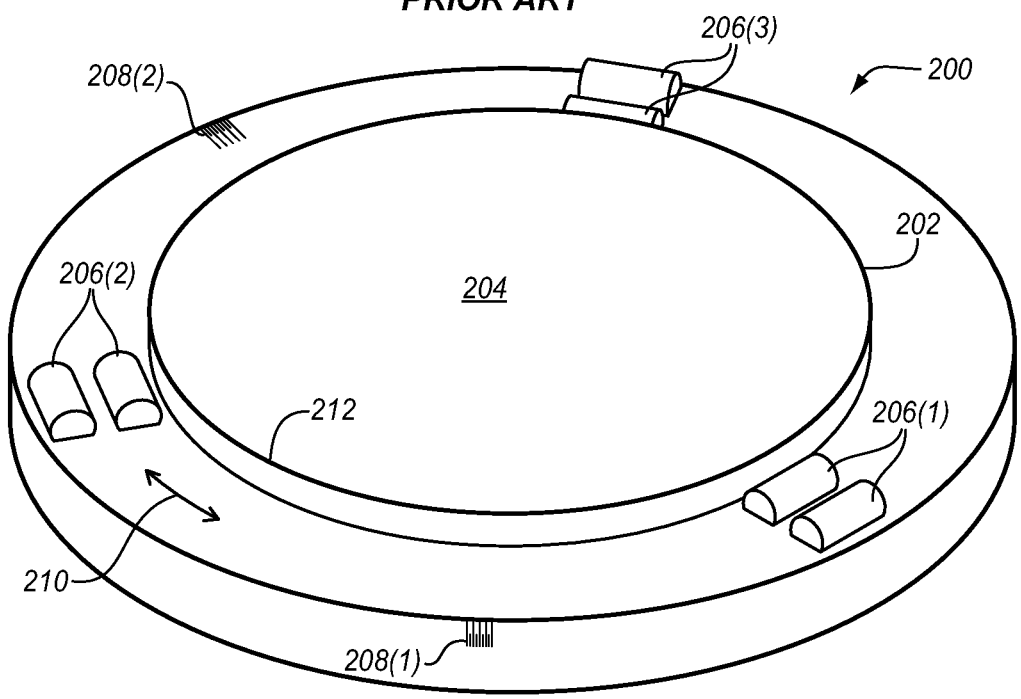
FIG. 2 is a top perspective view of a prior art vacuum chuck including a common base.
Figure 3:
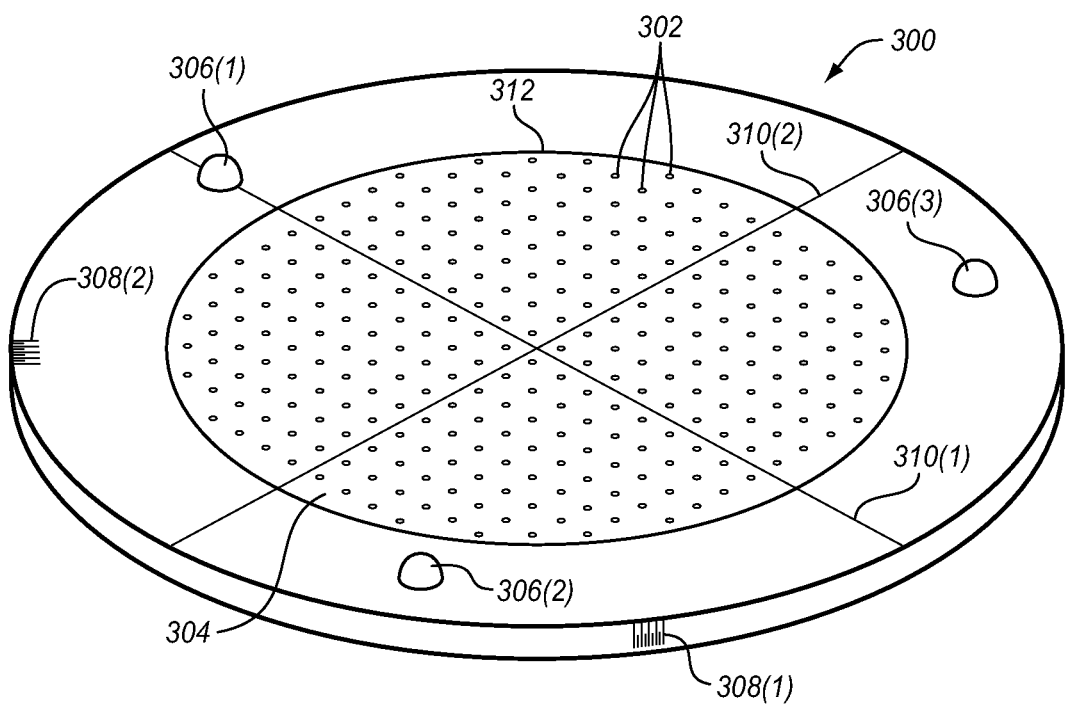
FIG. 3 is top perspective view of a prior art fabrication master that may be engaged with the vacuum chuck of FIG. 2.
Figure 4:
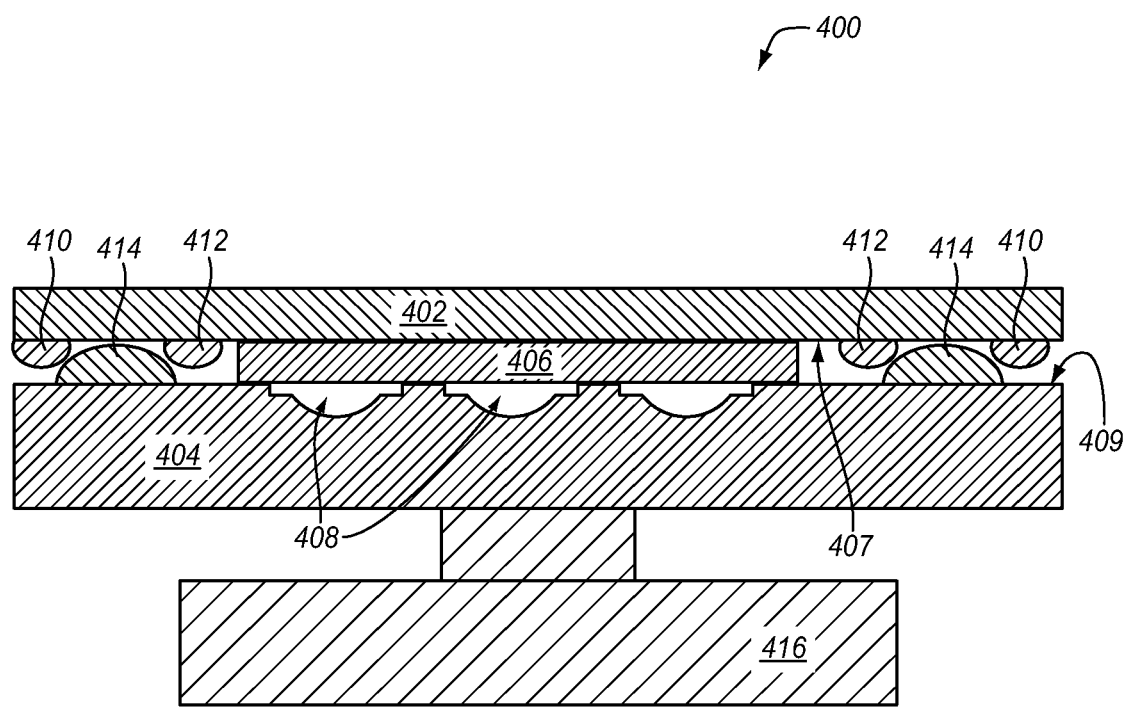
FIG. 4 is a cross-sectional view of a prior art replication system including a fabrication master, a vacuum chuck and a common base.
Figure 5:
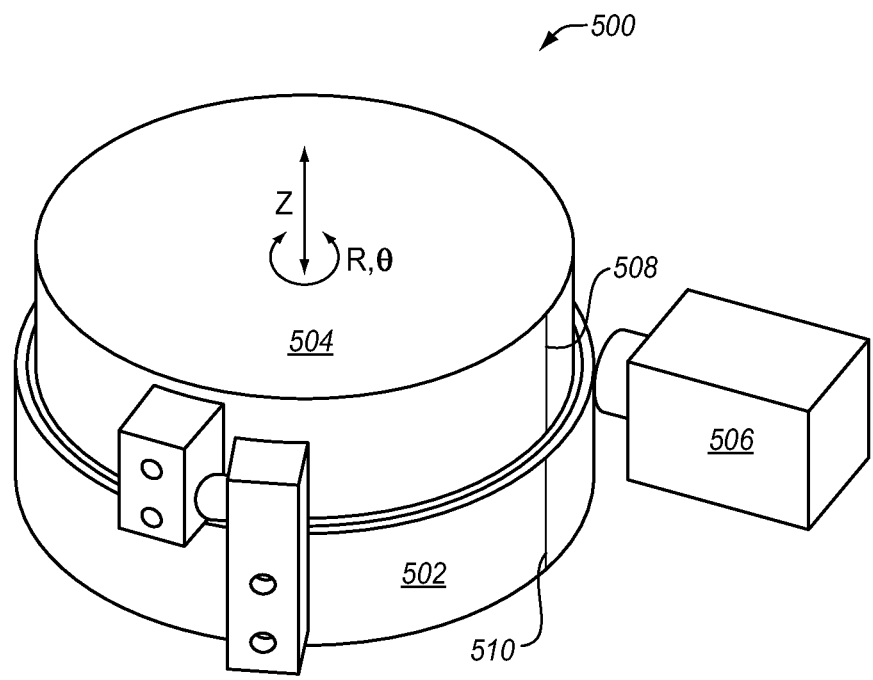
FIG. 5 is a perspective view of a prior art alignment system including a vacuum chuck, a fabrication master, and a vision system.
Figure 6:
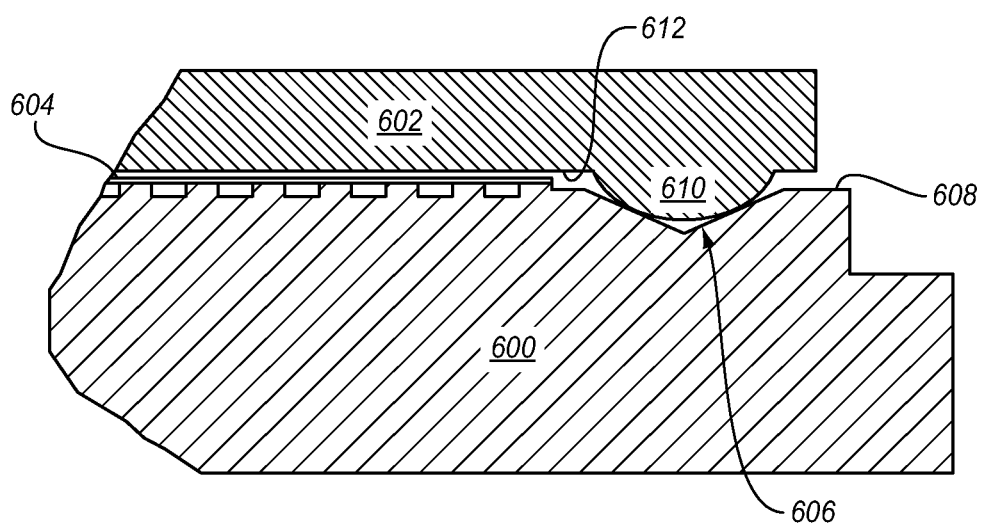
FIG. 6 is a cross-sectional view of prior art alignment structures.

FIGS. 7A and 7B show perspective views of a first object 700 and a second object 702 including first and second alignment structures 704 and 706, respectively, in accordance with an embodiment. Relatedly, FIGS. 7C and 7D illustrate engagement and alignment of first and second objects 700 and 702 via engagement and mating of first and second alignment structures 704 and 706, respectively. First and second objects 700 and 702 may be imaging system fixturing components such as, for example, a fabrication master configured for use in forming an array of optical elements of an imaging system, a vacuum chuck configured for retaining a common base, a detector array, an individual optical element. The alignment structures 704 and 706 of objects 700 and 702, respectively, are configured to enable full kinematic self-alignment between first and second objects 700 and 702, as will be described in further detail immediately hereinafter. Accordingly, pseudo-kinematic alignment and active alignment will also be enabled by alignment structures 704 and 706.

As shown in FIG. 7A, first alignment structure 704 on first object 700 is shown to include a contour incorporating a convex cross section (i.e., as generally viewed along a line 705 perpendicular to axis Z) formed on a surface 708. Similarly, as shown in FIG. 7B, second alignment structure 706 includes a contour incorporating a concave cross section (i.e., as generally viewed along line 709 perpendicular to axis Z) formed on or into a surface 710. The contours are configured such that first and second alignment structures 704 and 706 cooperate to enable full kinematic alignment between first and second objects 700 and 702. An example of such complementary mating and engagement is shown in a perspective view in FIG. 7C, and in a diametric cross-sectional view in FIG. 7D. As shown in FIG. 7C, when first and second objects 700 and 702 are oriented for engagement, a first surface contour 712 of first alignment structure 704 corresponds with a second surface contour 714 of second alignment structure 706. As shown in the diametric cross-sectional view of first and second objects 700 and 702 in FIG. 7D, first alignment structure 704 has a convex semicircular cross section and second alignment structure 706 is shaped as a v-groove.

In the embodiment shown in FIGS. 7A-7D, each of first and second surface contours 712 and 714, while being generally circular in the x-y plane (i.e., the plane normal to the z-axis), has its respective contour modulated by a smooth mathematical function, such as a sinusoid, in the z-direction. That is, the height of the contour may be expressed according to EQN. 1:

$$z = a_0 + a_1 \cos(n\theta), \qquad \text{EQN. 1}$$

Where parameters $a_0$, $a_1$, and n are constants. Parameter $a_0$ corresponds to a height or depth offset, parameter $a_1$ corresponds to the amplitude of the modulation, and parameter n corresponds to the number of periods of the periodic function. For example, as described in reference to FIG. 7E, in an exemplary embodiment, $a_0$=2.5 mm, $a_1$=2.5 mm, and n=3. Continuing to refer to FIG. 7E, additional parameters for a convex protrusion 716 may include a radius of 5 mm, a height of 2.27 mm, and a base width of 8.38 mm. Additional parameters for a v-groove 718 may include an opening angle of 105 degrees, a depth of 2.27 mm, and an opening width of 7.04 mm.

Figure 7E:
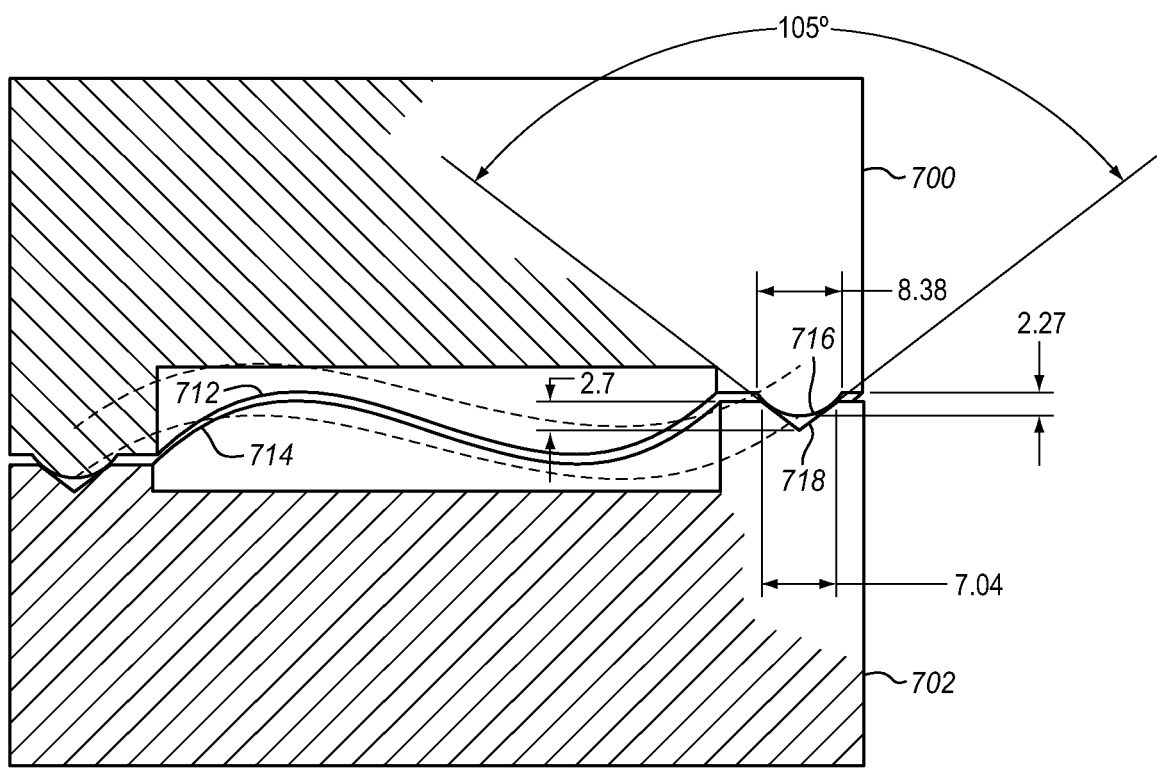
FIG. 7E is a partially dimensioned cross-sectional sectional view of the imaging system fixturing components of FIG. 7D, in accordance with an embodiment.

When engaged as shown in FIGS. 7D and 7E, alignment between objects 700 and 702, as well as movement of object 700 with respect to object 702, can be controlled in the x-, y-, and z-directions, as well as in all three rotational axes (as illustrated in FIG. 1). In other words, engagement of the sinusoidally modulated contours of first and second alignment structures 704 and 706 enables full kinematic alignment between objects 700 and 702. Alternatively, it is noted that the alignment structures need not be located near the outer periphery of a particular object, but may instead be located elsewhere on the objects (e.g., toward the center of the object).

Continuing to refer to FIGS. 7A-7E, first and second objects 700 and 702 may be coated with a durable, low-friction coating, such as a titanium nitride, diamond-like carbon, or TEFLON® so as to reduce friction when first and second alignment structures are brought into engagement. Then, if oriented in a vertical arrangement, as shown in FIG. 7C, the weight of an upper object alone may cause first and second objects 700 and 702 to passively self-align to a point of lowest potential energy with the assistance of gravity, and without additional manipulation required (although not excluded). Alternatively, if first and second objects 700 and 702 are oriented and engaged in a side-to-side manner (i.e., neither object is located above the other with respect to gravity), then first and second objects 700 and 702 may still be brought into alignment with only a minimal load. Self-alignment (or active alignment) may help to reduce potential deflection or unwanted deformation of the objects, which may in turn contribute to alignment errors. The dimensions of the contours of the alignment structures may be adjusted to compensate for the thickness of any such applied coating, in order to maintain proper alignment of and between objects 700 and 702.

The engagement of first and second objects 700 and 702 may take place in the context of replicating one or more optical elements. In this case, the amount of load required for alignment of the two objects may be proportional to the mass of the objects to be engaged, as well as any force required to properly shape moldable material disposed between the objects. For example, a low viscosity/modulus moldable material generally requires less applied force than a high viscosity/modulus material. In such cases it may be desirable to utilize both passive and active alignment capabilities of the objects.

First and second objects 700 and 702 may be fabricated with highly precise dimensions such that they may be repeatably engaged and disengaged in a passively self-aligning manner with an accuracy and precision of less than two microns in each of the x-, y-, and z-directions, and less than one degree in each of the three rotational directions relative to a nominal orientation. Furthermore, the repeated engagement does not require the use and/or presence of any additional alignment marks or vision systems, as was required in prior art systems. For example, fabrication masters or vacuum chucks may experience hundreds or thousands of repeated engagements during their standard lifespan; the alignment structures of the present embodiments advantageously enable repeatable alignment to within optical tolerances and under mass-production manufacturing conditions. The repeatability can thus be experienced under passive alignment, active alignment with an applied load, or a combination of both.

Referring again to FIG. 7D, the friction between first and second objects 700 and 702 may be further reduced by limiting the available points of contact between the objects. For instance, in this particular example, where first alignment structure 704 is a convex protrusion and second alignment structure 706 is a v-groove, the first and second alignment structures come into contact upon two circular line contact points (indicated by points 716 and 718). Frictional force between the objects 700 and 702 may be still further reduced by adding a friction-reducing medium (not shown) at the contact points. The friction-reducing medium may be, for example, a fluid (e.g., bearing oil) or a gas (e.g., nitrogen or air) that is known to reduce friction. Moreover, one or more medium channels 720 may be incorporated into one of the objects to allow inflow and/or outflow of a friction-reducing medium when the objects are in engagement. An opening 722 for the medium to flow into or out of channel 720 may be located at the nadir of the v-groove, for example, or at another suitable location An amplitude (indicated by double-headed arrows 724) of the sinusoidal modulation of surface contours 712 and 714 may be selected according to the machining tool used in the fabrication of these contours, as will be described at an appropriate juncture hereinafter.

While FIG. 7D shows an example of the mating and engagement of first and second alignment structures configured as a v-groove and a convex protrusion, second alignment structure 706 may instead be configured in a concave shape corresponding to the convex protrusion of first alignment structure 704. That is, while a v-groove reduces the amount of contact area between alignment structures 704 and 706, this particular shape is not a requirement. In other words, second alignment structure 706 may instead have a convex shape, which (in comparison to a v-groove shape) would increase the contact area between the two alignment structures. Accordingly, in such an example, a friction-reducing medium may be additionally employed between alignment structures so as to reduce friction therebetween.

In machining parlance, the surfaces of the alignment structures shown in FIGS. 7A and 7B are considered "free-form" surfaces, in that they may be realized by a machining tool programmed to be controllable in X, Z, and C coordinate directions, which are commonly used to define machine tool axes. For example, a spiral tool path raster may be defined starting at an outer radius of the alignment structure (e.g., first alignment structure 704) to be machined, and spiraling inwards to the inner radius of the alignment structure. This spiral tool raster path may be defined by tens of millions or more coordinate triplets (i.e., (X, Z, C)). Coordinate directions X, Z, and C may be equated with standard cylindrical coordinates R, Z and Θ, respectively.

Figure 8:
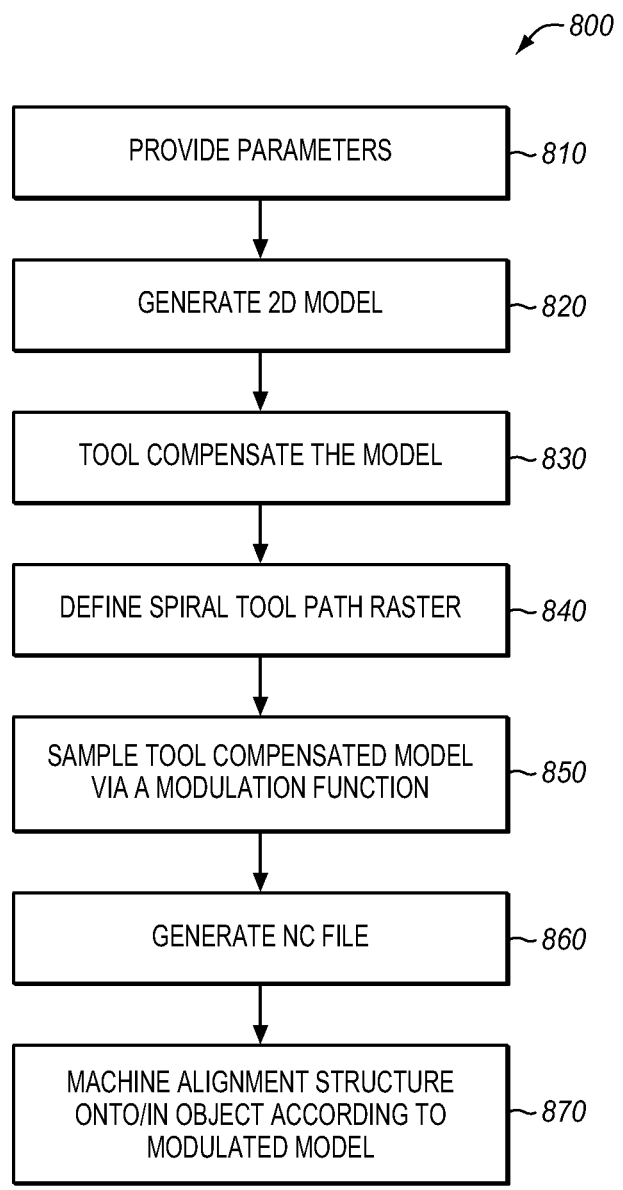
FIG. 8 is a flowchart illustrating a process of manufacturing alignment structures, according to an embodiment.

In accordance with an embodiment, the three-dimensional sinusoidal contours of the alignment structures of the present disclosure may be machined directly on or into the surface of the particular object by advantageously using only two-dimensional modeling parameters, rather than more labor-intensive three-dimensional modeling parameters commonly required to form such structures. An example of such a machining process using two-dimensional modeling parameters is described in reference to a process 800 shown in FIG. 8. According to process 800, parameters are provided in a step 810 for a machining tool and for a contour of the alignment structure to be machined. The parameters may include, but are not limited to, known characteristics of the cutting tool, such as the radius of the cutting tool to be used, and physical parameters describing the cross-section of the alignment structure to be fabricated. Next, in a step 820, a two-dimensional model of the structure to be machined, such as alignment structures 704 and 706, discussed above, is generated. Then, in a step 830, the two-dimensional model is modified using a tool compensation technique based on the parameters provided in step 810. In one example, when using C-axis machining with small X-axis feed rates, the cutting tool effectively only substantially has to move in the Θ direction perpendicular to the radial direction; consequently, tool compensation would then need only be performed in the radial direction (i.e., X coordinate direction).

In a step 840, a spiral machining tool path raster is defined. The tool-compensated model is then sampled, in a step 850, via a modulation function such as EQN. 1 defined above. In a step 860, a numerical control ("NC") file containing coordinate triplets or another parameterization, such as G-code or F-code commands, of the spiral raster path is generated and provided to the machining tool. In a step 870, the modeled and compensated contour is machined, thus forming the alignment structure.

In one example of process 800, the modulation function used in step 850 is a sinusoidal function applied in the Z coordinate direction. Alternatively, another function may be used as the modulation function, and the modulation function may be applied to coordinate directions other than the Z coordinate direction (e.g., the R coordinate direction).

By following process 800, a three-dimensional shape may be achieved by using only two-dimensional modeling techniques, thereby significantly reducing the amount of time and complexity normally required to program a machine tool to form a three-dimensional shape. This process of machining the alignment structures is also scalable, from a global array of optical element-forming features on a large object, to an individual optical element, where such scalability may be generally limited only by the specific capabilities of the utilized machining tool.

According to process 800 of machining an alignment structure onto an object, amplitude 724 in the z-direction of the sinusoidal modulation of surface contours 712 and 714 may be chosen in consideration of the machining tool used to form the contours and with respect to other manufacturing considerations related to the use of objects 700 and 702. For example, increasing amplitude 724 of the sinusoidal modulation may consequently increase the precision and/or alignment accuracy between objects 700 and 702. However, amplitude 724 may be limited by the clearance angle and other parameters of the machining tool; while most conventional machining tools may successfully create a sloped feature having an angle of up to fifteen degrees, some modern tools with improved clearances are capable of achieving slopes of up to thirty-two degrees or greater. The period of the sinusoidal modulation of surface contours 712 and 714 may also be chosen according to tool and manufacturing limitations and desired alignment precision. In general, a longer modulation period (i.e., fewer sinusoidal modulation per rotation of objects 700 and 702) may be more easily integrated into the design of a larger tool. However, a shorter, odd-numbered modulation period may increase the alignment precision of the objects because symmetry that may be evidenced by using even-numbered periods creates a chance of aligning the objects out of phase with each other. For example, an imaging system fixturing component with an even-numbered period may be rotated one hundred and eighty degrees and the resulting arrays of formed optical elements may be properly spatially aligned, but improperly rotated by one hundred and eighty degrees. In the embodiments shown in FIGS. 7A-7D, the modulation period is illustrated to be 3 Hz. As described above though, one skilled in the art will understand, after reading and fully appreciating this disclosure, that this particular frequency is not limiting, and that the selected period may be longer or shorter.

Figure 9A:
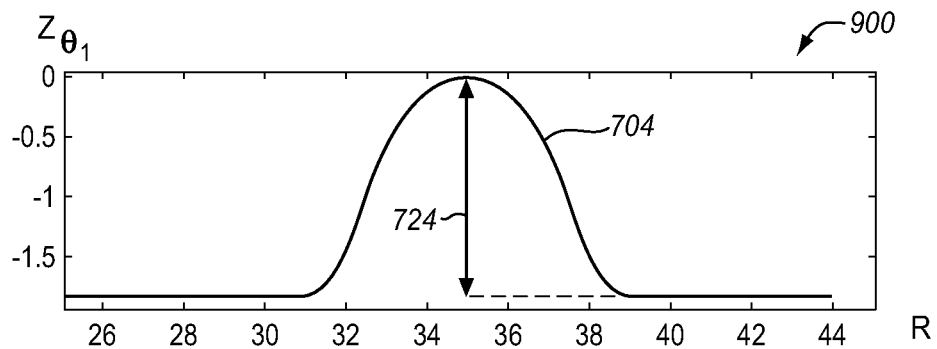
FIGS. 9A and 9B show plots of radial cross sections of alignment structures, according to an embodiment.
Figure 9B:
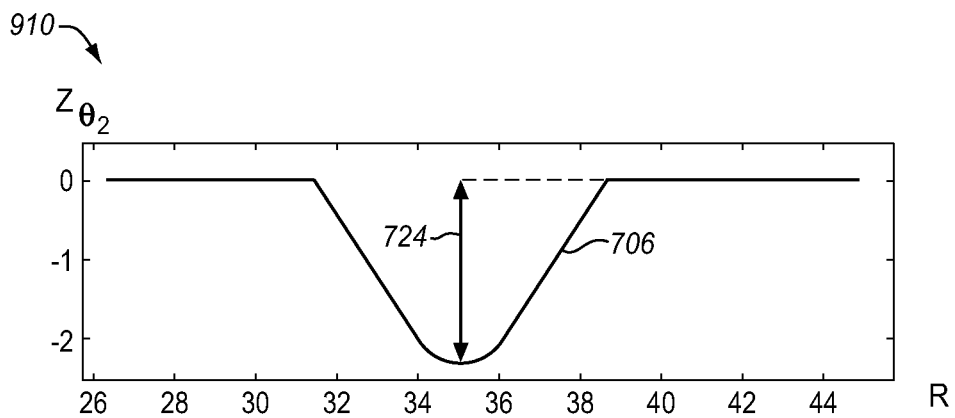

Now referring to FIGS. 9A and 9B, which show plots 900 and 910 of radial cross sections of alignment structures 700 and 702, respectively. Plots 900 and 910 both have a normalized radial coordinate (R or X) as the abscissa and a normalized z coordinate as the ordinate. It should be noted that, since machining operations remove material, plots 900 and 910 show the z coordinate of the cross sections as zero or negative values. Specifically, FIG. 9A shows a plot 900 of a machined amplitude (height) 724 of a protruding alignment structure (e.g., alignment structure 704) in the z-direction versus radial distance from an object's central axis, and corresponding with radial line 705 in FIG. 7A. FIG. 9B shows a plot 910 of a machined amplitude (depth) 724 of a v-groove alignment structure (e.g., alignment structure 706) in the z-direction versus radial distance from an object's central axis and corresponding with radial line 709 in FIG. 7B.

Figure 10:
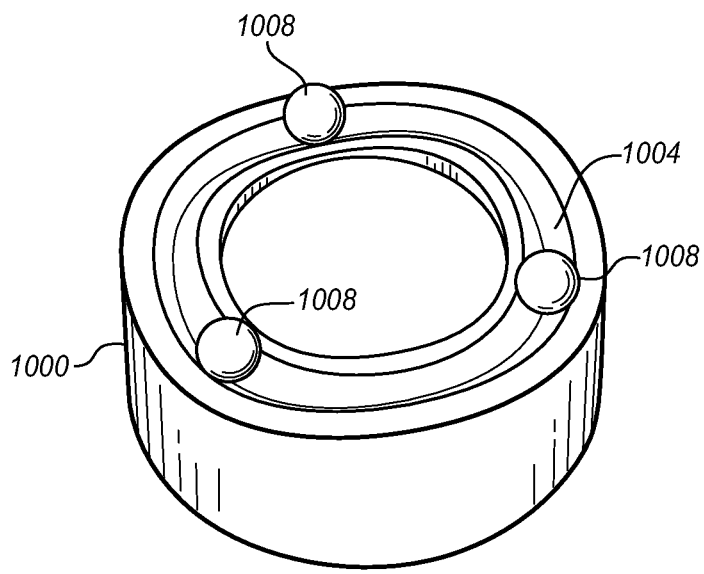
FIG. 10 is a perspective view of an imaging system fixturing component having an alignment structure, according to an embodiment.
Figure 11:
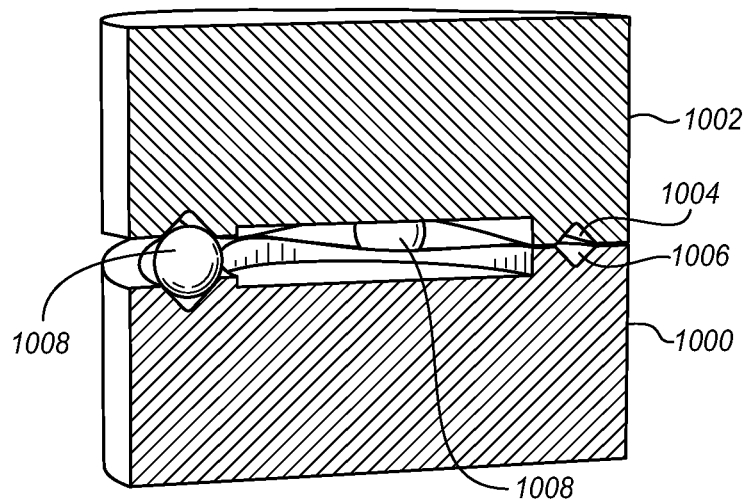
FIG. 11 is a cross-sectional perspective view of a set of imaging system fixturing components including alignment structures, according to an embodiment.
Figure 12:
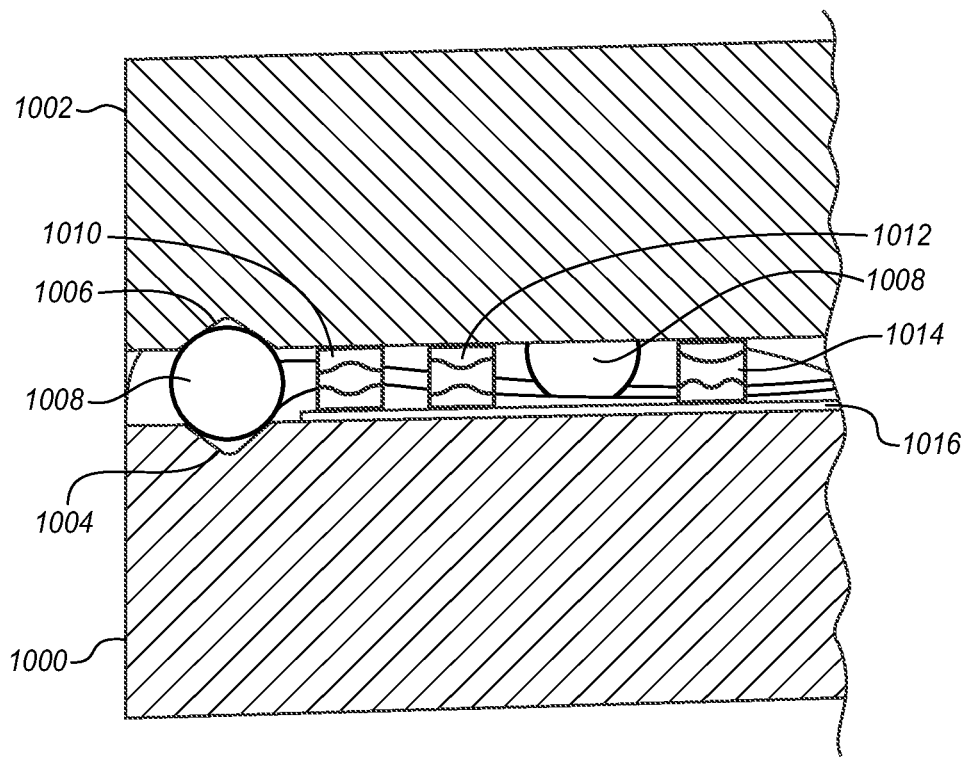
FIG. 12 is the cross-sectional, enlarged view of FIG. 11, shown here to illustrate further details of the alignment structures.

FIGS. 10-12 illustrate a different pair of objects 1000 and 1002, which may be utilized as imaging system fixturing components. FIG. 10 shows a perspective view of an imaging system fixturing component having an alignment structure. FIG. 11 shows a cross-sectional perspective view of a set of imaging system fixturing components including alignment structures. FIG. 12 shows the cross-sectional perspective view of FIG. 11 including further details. In these figures, a set of alignment structures 1004 and 1006, on objects 1000 and 1002, respectively, are not shown as complementary structures, but instead as duplicates of one another with an added inclusion of a one hundred and eighty degree phase shift in the Θ coordinate in modulation of the contour amplitude. Specifically, alignment structures 1004 and 1006 are both v-grooves that align relative to one another according to intervening displacement objects 1008. Displacement objects 1008 may serve both to displace objects 1000 and 1002 at a chosen distance, and to align objects 1000 and 1002 relative to one another.

When vertically oriented, object 1002 can be, for example, disposed and engaged upon the object 1000, as shown in FIG. 11, with displacement objects 1008 placed therebetween. Referring to FIG. 10, displacement objects 1008 may first be placed in the concave alignment structure 1004 on object 1000, which may become the lower object of FIG. 11, at generally equidistant locations in the lowest lying regions of the modulation of the contour. When displacement objects 1008 are round or spherical (e.g., round, solid balls), as in this example, highly precise or accurate placement is not required to locate displacement objects 1008 in v-groove 1004, since displacement objects 1008, under the effect of gravity, roll into equidistant positions of lowest potential energy. As shown in FIG. 11, when upper object 1002 is disposed upon lower object 1000, objects 1000, 1002 may passively self-align relative to one another via low-friction displacement objects 1008 that each rest in the opposing v-grooves of alignment structures 1004 and 1006. Displacement objects 1008 may be, for example, formed of a deformation-resistant material, such as silicon nitride spheres available from Baltec of Los Angeles, Calif. Displacement objects 1008 may also be coated with a durable, friction-reducing material, such as any of those discussed above, that allows freer movement of displacement objects 1008 relative to objects 1000 and 1002.

FIG. 12 shows a cross-sectional illustration of the objects, alignment structures, and displacement objects shown in FIGS. 10 and 11, when utilized for the formation of an array of imaging systems 1010, 1012, and 1014. In this example, object 1000 is a vacuum chuck and object 1002 is a fabrication master. Individual imaging systems 1010, 1012, and 1014 are illustrated as stacks of optical elements formed on a common base 1016. As each new element of the stacked imaging systems 1010, 1012, and 1014 is formed, the spacing between the objects 1000 and 1002 may increase accordingly. To increase the distance between objects 1000 and 1002 in this embodiment, displacement objects 1008 therebetween need only be chosen of an appropriate diameter. Displacement objects 1008 of successively increasing diameters may thus be chosen for each successive layer that is added to imaging systems 1010, 1012, and 1014. An advantage of this embodiment is that each fabrication master 1002, regardless of the order in which it engages with object 1000, can have formed therein an alignment structure identical to that of all other fabrication masters. Consistency in machining alignment structures on different imaging system fixturing components can thereby be advantageously increased.

As can be observed from FIGS. 10-12, although objects 1000 and 1002 are shown associated with three separate displacement objects 1008, the objects may be associated with another suitable quantity other than three. The number of displacement objects may be, for example, equal to the number of modulation periods of the contour of the associated alignment structure. Although alignment structures 1004 and 1006 are illustrated as v-grooves, the alignment structures may alternatively be formed according to other suitable shapes (e.g., semicircular, concave) that accommodate one or more displacement objects 1008. Displacement objects 1008 may have a shape that complements both opposing alignment structures, while also allowing the objects to passively self-align under self-loading. In the example where the two opposing objects are vertically oriented, the mass of the upper object, by itself, may satisfy minimal load requirements. The minimal load requirement may be defined relative to a finite element stress analysis and modeled deflections and deformations. Acceptable values for a load may be defined as those loads which do not cause deflections or deformations on the order of optical tolerances, such as a two micron deflection.

Figure 13A:
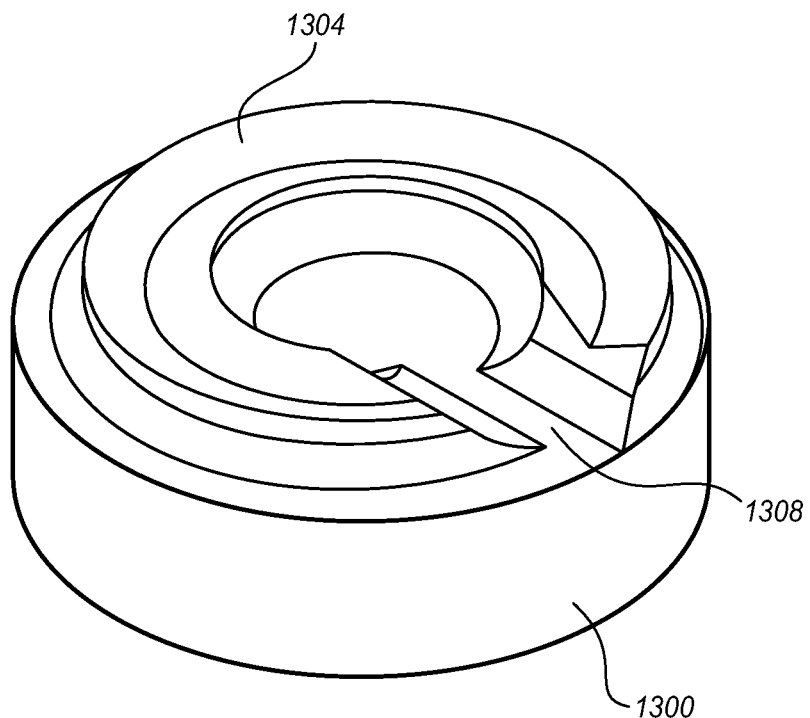
FIGS. 13A and 13B are perspective views of imaging system fixturing components including alignment structures, according to an embodiment.
Figure 13B:
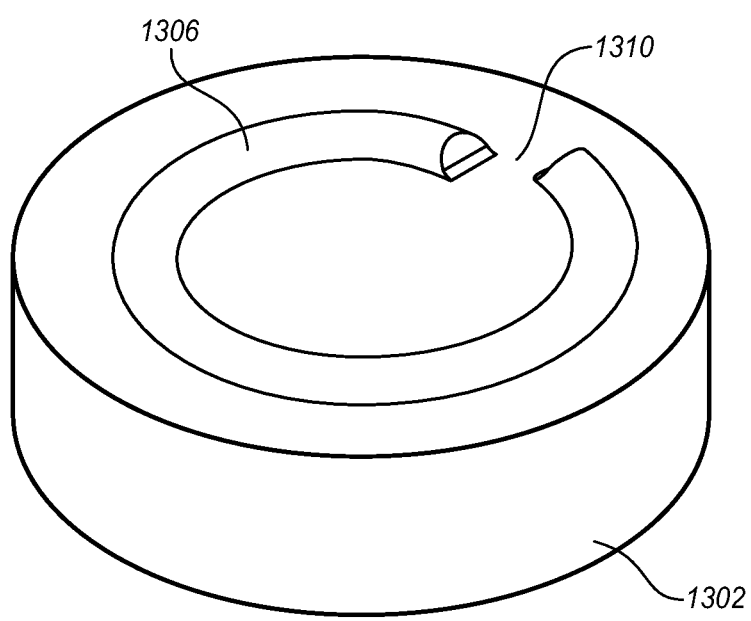

FIGS. 13A and 13B show perspective views of a pair of objects 1300 and 1302 which include alignment structures 1304 and 1306, respectively. Alignment structure 1304 is shown as a v-groove and alignment structure 1306 is shown as a convex protrusion having a semicircular cross-section. Unlike the objects and alignment structures shown in FIGS. 7A and 7B, alignment structures 1304 and 1306 are not continuous, but rather include at least a single discontinuity. Furthermore, alignment structures 1304 and 1306, unlike kinematic enabling alignment structures 704 and 706, are not constant functions of the radial coordinate R. As described above, the z-component of alignment structures 704 and 706 is modulated sinusoidally while the radius R was held constant. As shown in FIGS. 13A and 13B, alignment structures 1304 and 1306 are not modulated according to height or depth in order to facilitate passive self-alignment between the objects. Instead, the radius R is modulated according to a spiral mathematical function R=c*θ, where c is a constant and θ is the azimuthal coordinate.

Figure 14A:
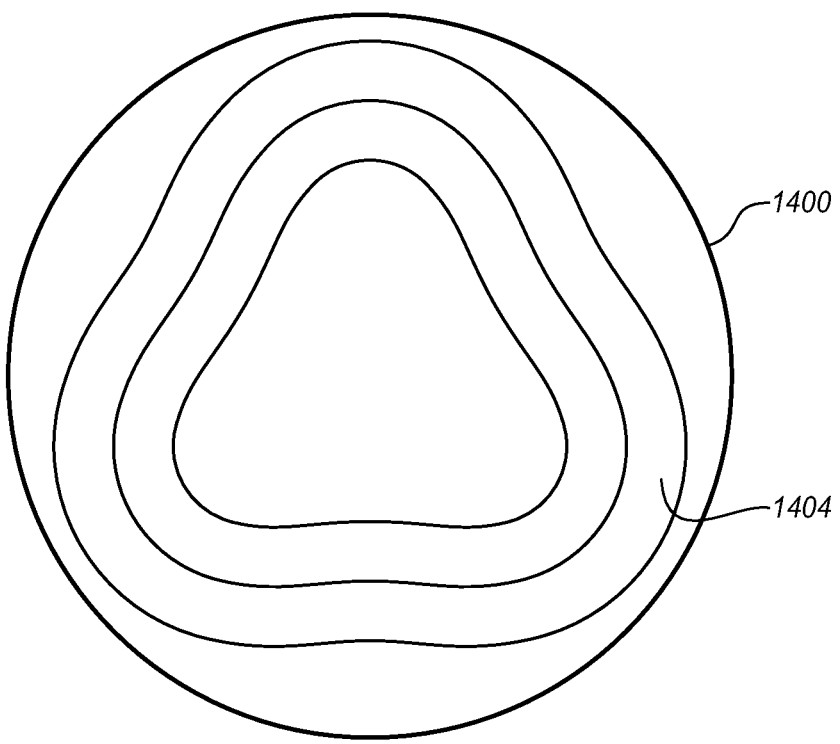
FIGS. 14A and 14B are plan views of imaging system fixturing components including alignment structures, according to an embodiment.
Figure 14B:
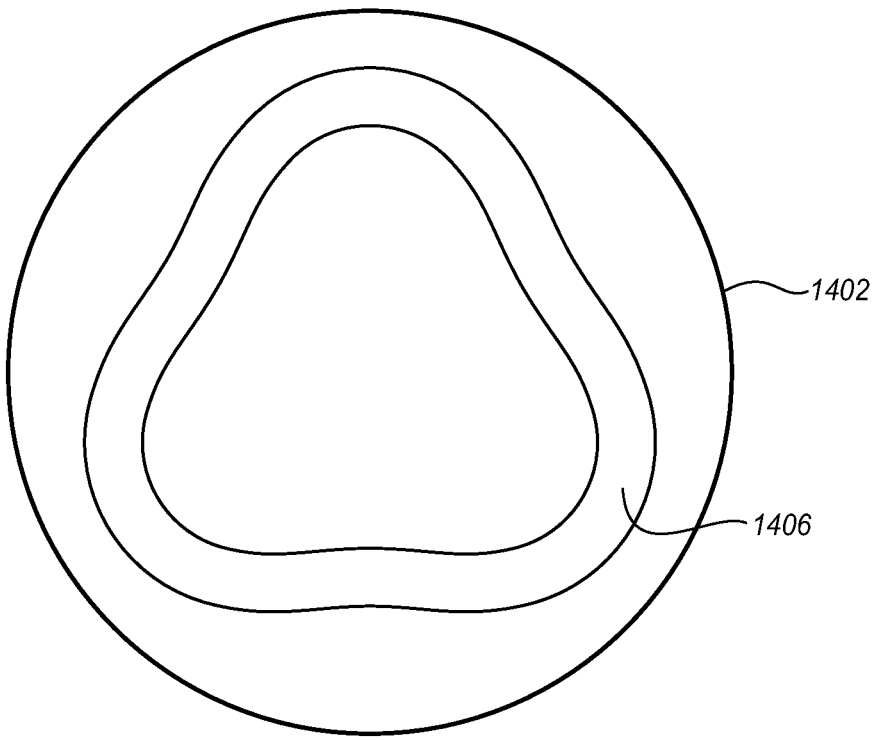

As an alternative embodiment, FIGS. 14A and 14B show plan views of kinematic enabling alignment structures 1404 and 1406, defined by the mathematical function EQN2:

$$R=b_0+b_1 \cos(m\theta), \quad \text{EQN. 2}$$

where $b_0$, $b_1$, and m are constants and the z-component of the structures remains constant. As may be understood from a comparison of the mathematical functions defining alignment structures 704, 706, 1304, 1306, 1404 and 1406, passive full kinematic alignment with optical precision and accuracy may be enabled between a pair of imaging system fixturing components by selection of appropriate contours and relationships between coordinate directions. According to the above disclosure, alignment structures made according to equations 1 or 2, for example, provide a mathematically defined contour that is interrelated in at least two coordinate directions.

Changes may be made in the above processes and systems without departing from the scope hereof. For example, although the present disclosure illustrates the utilization of sinusoidal and spiral mathematical functions for defining the alignment structures, powers of sinusoidal function, trigonometric functions, or other classes of periodic or smoothly varying functions may be utilized. It should further be noted that the matter contained in the above description or shown in the accompanying drawings should be interpreted as illustrative, and not in a limiting sense. The following claims are intended to cover generic and specific features described herein, as well as statements of the scope of the present process and system, which, as a matter of language, might be said to fall therebetween.

What is claimed is:

1. A method for aligning first and second imaging system fixturing components, comprising:
   forming a first alignment structure on the first imaging system fixturing component;
   forming a second alignment structure on the second imaging system fixturing component; and
   engaging the first and second alignment structures to align, with optical accuracy, the first and second imaging system fixturing components,
   wherein the step of engaging the first and second alignment structures further comprises positioning one or more displacement objects between the first and second alignment structures, wherein the displacement objects comprise at least three solid, spherical balls.

2. A method for aligning and forming optical elements with a common base, comprising:
   foaming a base alignment structure on the common base, the base alignment structure having a mathematically defined contour that is interrelated in at least two coordinate directions;
   forming a first alignment structure on a first fabrication master, the first fabrication master configured for shaping a first moldable material, the first alignment structure having a mathematically defined contour that is interrelated in at least two coordinate directions and being capable of mating with the base alignment structure; and
   engaging the common base and the first fabrication master by mating the base alignment structure with the first alignment structure, thereby shaping the first moldable material to align and form at least one of the optical elements,
   wherein the first alignment structure and the base alignment structures each comprise corresponding v-grooves.

3. The method of claim 2, wherein the first fabrication master and common base are relatively positioned by spherical balls situated in the corresponding v-grooves when the common base and the first fabrication master are engaged.

* * * * *

UNITED STATES PATENT AND TRADEMARK OFFICE
CERTIFICATE OF CORRECTION

PATENT NO. : 8,780,211 B2  
APPLICATION NO. : 13/932656  
DATED : July 15, 2014  
INVENTOR(S) : George C. Barnes, IV et al.

Page 1 of 1

It is certified that error appears in the above-identified patent and that said Letters Patent is hereby corrected as shown below:

Title Page
Item (62) Related U.S. Application Data "Jun. 21, 2013" should read --Jun. 21, 2010--

In the Specification
Column 1, Line 7 "Jun. 21, 2013" should read --Jun. 21, 2010--

Signed and Sealed this
Twenty-second Day of March, 2016

Michelle K. Lee
*Director of the United States Patent and Trademark Office*